(12) United States Patent
Chen et al.

(10) Patent No.: US 9,355,893 B1
(45) Date of Patent: May 31, 2016

(54) METHOD FOR PREVENTING EXTREME LOW-K (ELK) DIELECTRIC LAYER FROM BEING DAMAGED DURING PLASMA PROCESS

(71) Applicant: Taiwan Semiconductor Manufacturing Co., Ltd, Hsin-Chu (TW)

(72) Inventors: Hung-Hao Chen, Hsinchu (TW); Yu-Shu Chen, Hsinchu (TW); Yu-Cheng Liu, Zhubei (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 14/600,452

(22) Filed: Jan. 20, 2015

(51) Int. Cl.
*H01L 21/768* (2006.01)

(52) U.S. Cl.
CPC ................ *H01L 21/76808* (2013.01)

(58) Field of Classification Search
CPC .............. H01L 21/76807; H01L 21/76808; H01L 21/76814; H01L 21/76877
See application file for complete search history.

(56) References Cited

U.S. PATENT DOCUMENTS

2004/0192058 A1* 9/2004 Chu .................. H01L 21/76808 438/710

* cited by examiner

*Primary Examiner* — Daniel Shook
(74) *Attorney, Agent, or Firm* — Birch, Stewart, Kolasch & Birch, LLP

(57) ABSTRACT

A method for forming an interconnect structure is provided. The method includes providing a substrate. The method also includes forming a dielectric layer on the substrate, and the dielectric layer includes an extreme low-k (ELK) dielectric layer. The method includes forming a via hole in the dielectric layer and forming a photoresist in the via hole and on the dielectric layer. The method also includes removing the photoresist by a plasma process using a $C_xH_yO_z$ gas and forming a conductive structure in the via hole.

20 Claims, 9 Drawing Sheets

METHOD FOR PREVENTING EXTREME LOW-K (ELK) DIELECTRIC LAYER FROM BEING DAMAGED DURING PLASMA PROCESS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line.

In the fabrication of semiconductor devices, the size of semiconductor devices has been continuously reduced in order to increase device density. Accordingly, a multi-layered interconnect structure is provided. The interconnect structure includes a conductive feature embedded in a dielectric material with a low-k (ELK) dielectric constant.

Although existing interconnect structures with low-k dielectric layers have been generally adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
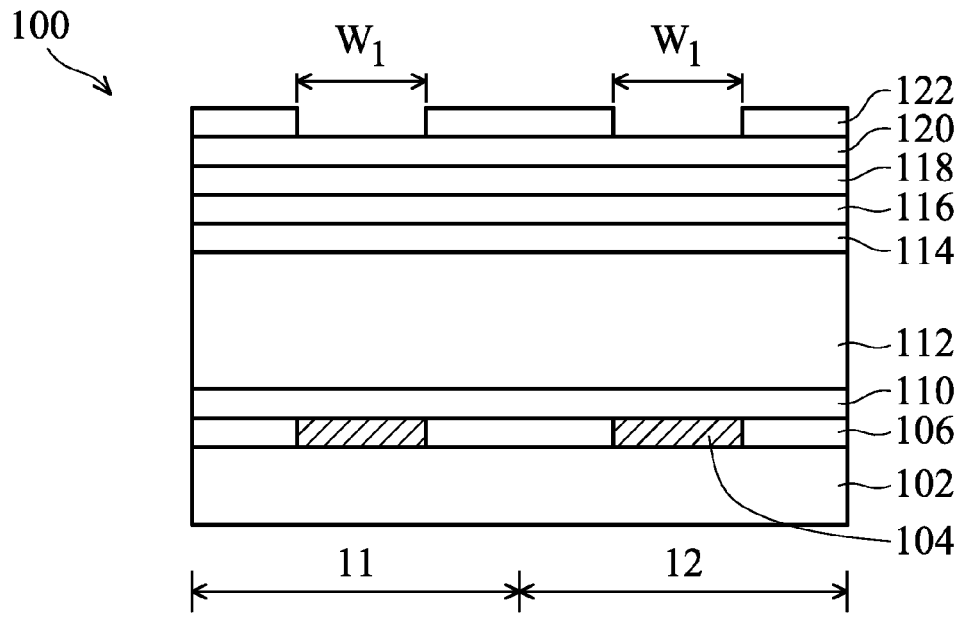
FIGS. 1A-1L show cross-sectional representations of various stages of forming an interconnect structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor structure with an interconnect structure are provided. The interconnect structure includes a number of metallization layers formed in an extreme low-k (ELK) dielectric layer (such as inter-metal dielectric, IMD) with a dielectric constant (k) less than about 2.5. One process for forming an interconnect structure is the damascene process. The damascene process includes a photoresist stripping process, such as a plasma process. ELK dielectric layer is susceptible to damage from the plasma process because it is softer, less chemically stable, and more porous. This damage may cause a higher resistance (Rc) and therefore degrade the performance of the semiconductor device. Therefore, the disclosure provides a method to prevent an ELK dielectric layer from being damaged during plasma process.

FIGS. 1A-1I show cross-sectional representations of various stages of forming a semiconductor device structure 100 with an interconnect structure, in accordance with some embodiments of the disclosure. FIGS. 1A-1I show a two-patterning-two-etching (2P2E) process for forming a dual damascene structure. In a 2P2E process, a dielectric layer is patterned and etched twice to form two patterns in dielectric layer.

Referring to FIG. 1A, semiconductor device structure 100 includes a substrate 102. Substrate 102 includes a first region 11 and a second region 12 adjacent to first region 11. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

Some device elements (not shown) are formed in substrate 102. Device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in substrate 102 in a front-end-of-line (FEOL) process.

Substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on substrate 102, in a P-well structure, in an N-well structure or in a dual-well structure.

Substrate 102 may further include isolation features (not shown), such as shallow trench isolation (STI) features or local oxidation of silicon (LOCOS) features. Isolation features may define and isolate various device elements.

As shown in FIG. 1A, a first dielectric layer 106 (such as inter-metal dielectric, IMD) is formed on substrate 102, and a first conductive feature 104 is embedded in first dielectric layer 106. First dielectric layer 106 and first conductive feature 104 are formed in a back-end-of-line (BEOL) process.

First dielectric layer 106 may be a single layer or multiple layers. In some embodiments, first dielectric layer 106 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, ELK dielectric material is deposited by a plasma enhanced chemical vapor deposition (PECVD) process or by a spin coating process.

In some embodiments, first conductive feature 104 is made of copper (Cu), copper alloy, aluminum (Al), aluminum alloy, tungsten (W), tungsten alloy, titanium (Ti), titanium alloy, tantalum (Ta) or tantalum alloy. In some embodiments, first conductive feature 104 is formed by a plating method.

A first etch stop layer 110 is formed on first dielectric layer 106. Etch stop layer 110 may be a single layer or multiple layers. First etch stop layer 110 is made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material. In some embodiments, first etch stop layer 110 has a bi-layer structure which includes a TEOS layer formed on a SiC layer. A TEOS layer has better moisture prevention than a silicon carbide (SiC) layer. In addition, a SiC layer is used as a glue layer to improve adhesion between the underlying layer and the TEOS layer.

A second dielectric layer 112 is formed on first etch stop layer 110. Second dielectric layer 112 may be a single layer or multiple layers. In some embodiments, second dielectric layer 112 includes an extreme low-k (ELK) dielectric layer. ELK dielectric layer is made of ELK dielectric material which has a dielectric constant (k) less than about 2.5. ELK dielectric materials include carbon doped silicon oxide, amorphous fluorinated carbon, parylene, bis-benzocyclobutenes (BCB), polytetrafluoroethylene (PTFE) (Teflon), orsilicon oxycarbide polymers (SiOC). In some embodiments, ELK dielectric materials is made of a material including a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, ELK dielectric material is deposited by a plasma enhanced chemical vapor deposition (PECVD) process or by a spin coating process.

A second etch stop layer 114, a hard mask layer 116 and an anti-reflective layer (ARC) 118 are sequentially formed on second dielectric layer 112. In some embodiments, second etch stop layer 114 is made of nitrogen-free material, such as silicon oxycarbide (SiOC). In some embodiments, hard mask layer 116 is made of a metal material, such as titanium nitride (TiN), tantalum nitride (TaN), or tungsten nitride (WN). Hard mask layer 116 made of metal material is configured to provide a high etching selectivity to second dielectric layer 112 during the plasma process. In some embodiments, ARC layer 118 is made of nitrogen-free material, such as silicon oxycarbide (SiOC).

A bottom anti-reflective coating (BARC) layer 120 is formed on ARC layer 118, and a first photoresist (PR) layer 122 is formed on BARC layer 120. In some embodiments, BARC layer 120 is made of silicon oxynitride (SiON), silicon rich oxide, or silicon oxycarbide (SiOC).

First PR layer 122 may be positive photoresist or negative photoresist. In some embodiments, first PR layer 122 is made of Poly (methyl methacrylate) (PMMA), Poly (methyl glutarimide) (PMGI), Phenol formaldehyde resin (DNQ/Novolac), SU-8 or another applicable material. These materials are applied as a liquid and spin-coated to ensure uniformity of thickness.

Afterwards, first PR layer 122 is patterned by a patterning process. As a result, a patterned first PR layer 122 is obtained that has a number of openings, and each of the openings has a first width $W_1$. Patterning process includes a photolithography process and an etching process. Photolithography processes include photoresist coating (e.g., spin-on coating), soft baking, mask aligning, exposure, post-exposure baking, developing photoresist, rinsing and drying (e.g., hard baking). Etching process includes a dry etching process or a wet etching process.

Figure 1B:
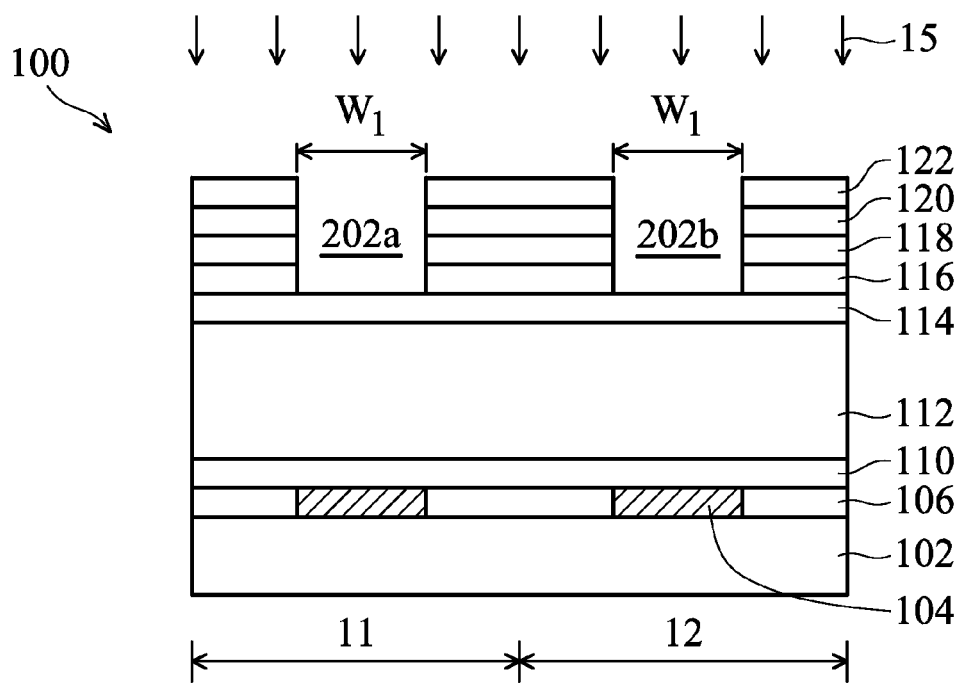

After first PR layer 122 is patterned, a first etching process 15 is performed on BARC layer 120, ARC layer 118, hard mask layer 116 by using patterned first PR layer 122 as a mask as shown in FIG. 1B, in accordance with some embodiments of the disclosure. First etching process 15 is stopped at second etch stop layer 114. In some other embodiments, a portion of second etch stop layer 114 is slightly removed.

As a result, in first region 11, a first trench opening 202a is formed in BARC layer 120, ARC layer 118 and hard mask layer 116 to expose second etch stop layer 114. In second region 12, a second trench opening 202b is formed in BARC layer 120, ARC layer 118 and hard mask layer 116 to expose second etch stop layer 114. In some embodiments, first etching process 15 includes multiple etching processes to remove a different layer below first PR layer 122.

Figure 1C:
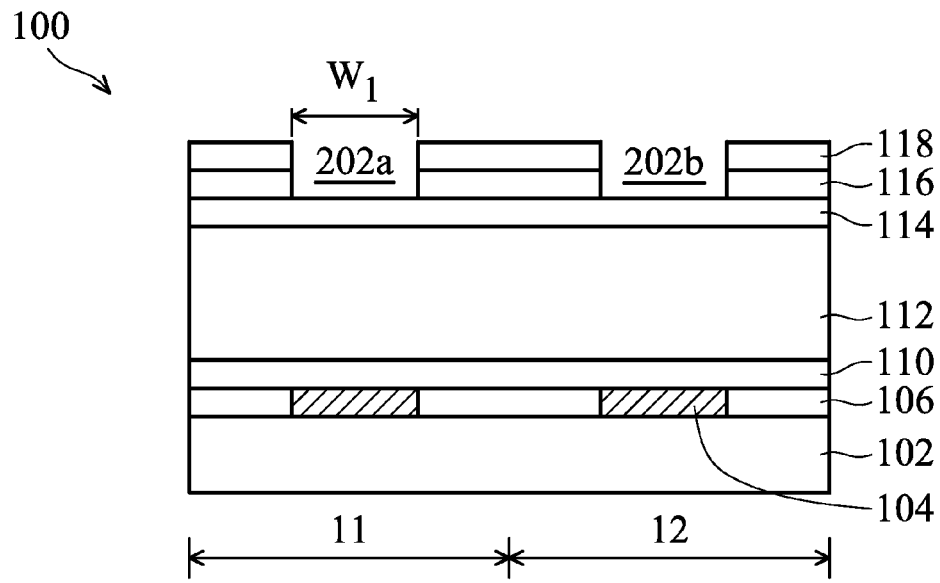

Afterwards, first PR layer 122 and BARC layer 120 are removed as shown in FIG. 1C, in accordance with some embodiments of the disclosure. In some embodiments, first PR layer 122 and BARC layer 120 are removed by an etching process, such as a wet etching process or a dry etching process.

Figure 1D:
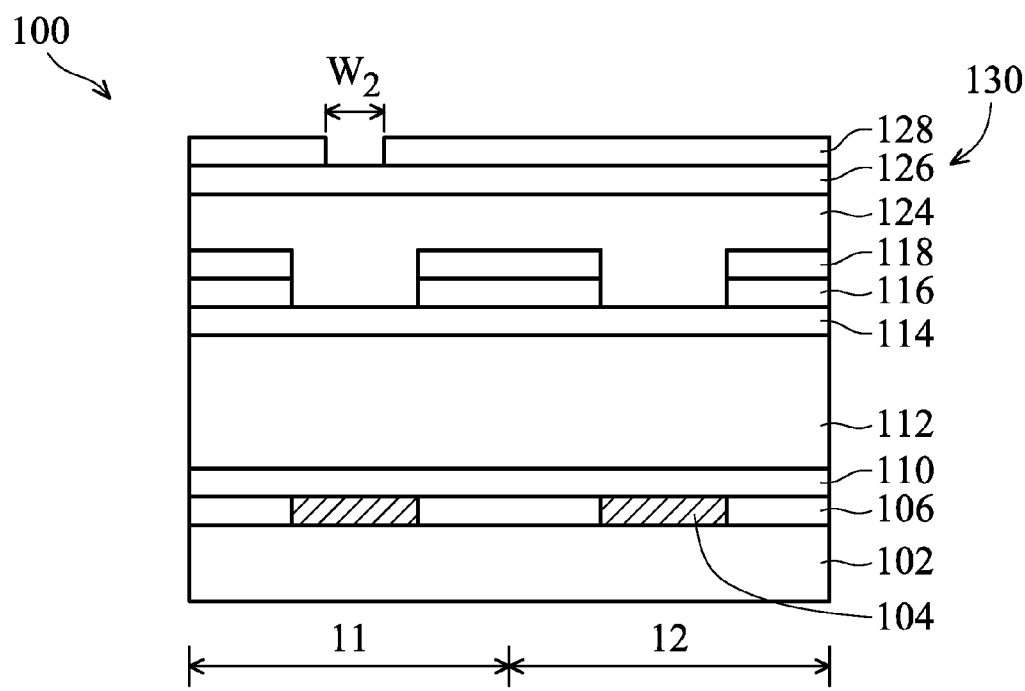

After first PR layer 122 and BARC layer 120 are removed, a first photoresist (PR) structure 130 is formed in trench openings 202a, 202b and on ARC layer 118 as shown in FIG. 1D, in accordance with some embodiments of the disclosure.

In some embodiments, first PR structure 130 is a tri-layer structure which includes a first bottom anti-reflective coating (BARC) layer 124, a first middle layer 126 and a first top layer 128. In some embodiments, first BARC layer 124 is made of silicon oxynitride (SiON), silicon rich oxide, or silicon oxycarbide (SiOC). In some embodiments, first middle layer 126 is made of silicon nitride, silicon oxynitride or silicon oxide. In some embodiments, first top layer 128 is made of Poly (methyl methacrylate) (PMMA), Poly (methyl glutarimide) (PMGI), Phenol formaldehyde resin (DNQ/Novolac) or SU-8.

Afterwards, first top layer 128 is patterned to form a patterned first top layer 128. In first region 11, patterned first top layer 128 has an opening with a second width $W_2$ which is smaller than first width $W_1$.

Figure 1E:
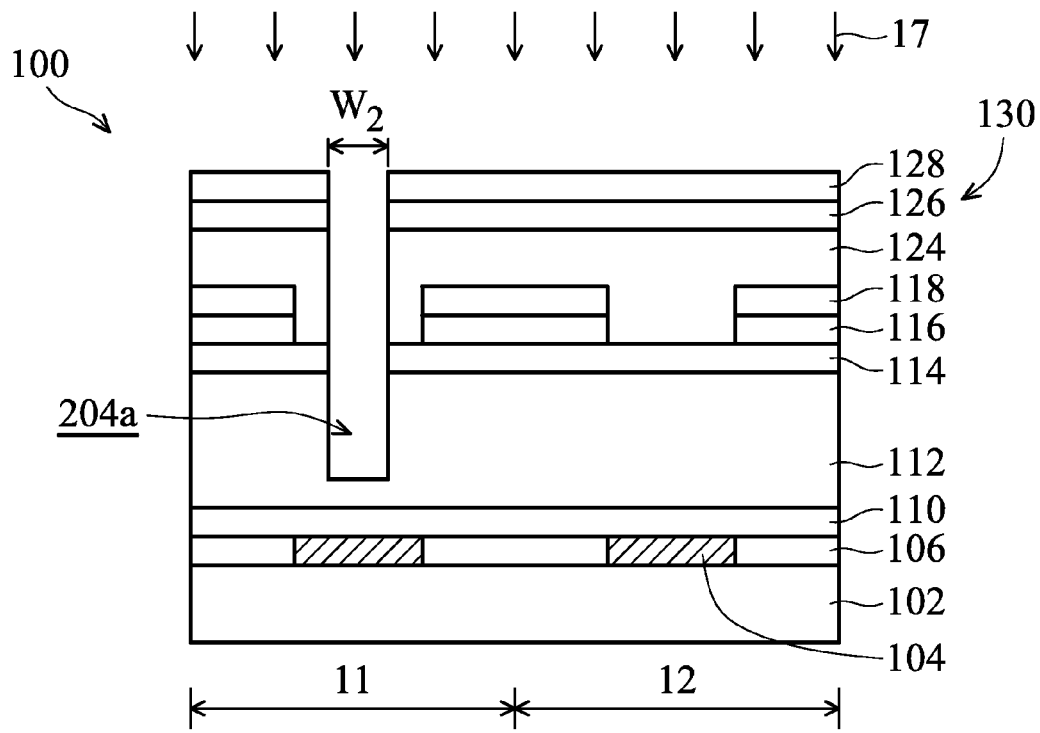

After first top layer 128 is patterned, a second etching process 17 is performed on first middle layer 126, first BARC layer 124, ARC layer 118, hard mask layer 116, second etch stop layer 114 and second dielectric layer 112 as shown in FIG. 1E, in accordance with some embodiments of the disclosure. Second etching process 17 includes multiple etching processes to remove a different layer below first top layer 128. As a result, in first region 11, a first via hole 204a is formed in second dielectric layer 112. First via hole 204a has a second width $W_2$ which is smaller than first width $W_1$ (first width $W_1$ is shown in FIG. 1C).

Figure 1F:
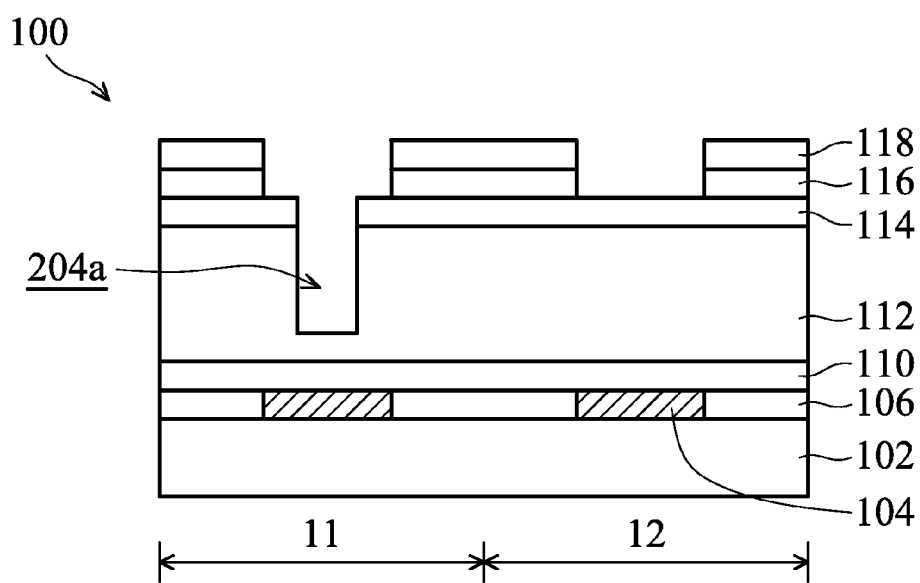

After first via hole 204a is formed, first PR structure 130 is removed as shown in FIG. 1F, in accordance with some embodiments of the disclosure. First PR structure 130 is removed by multiple etching processes because first PR structure 130 includes different materials.

Figure 1G:
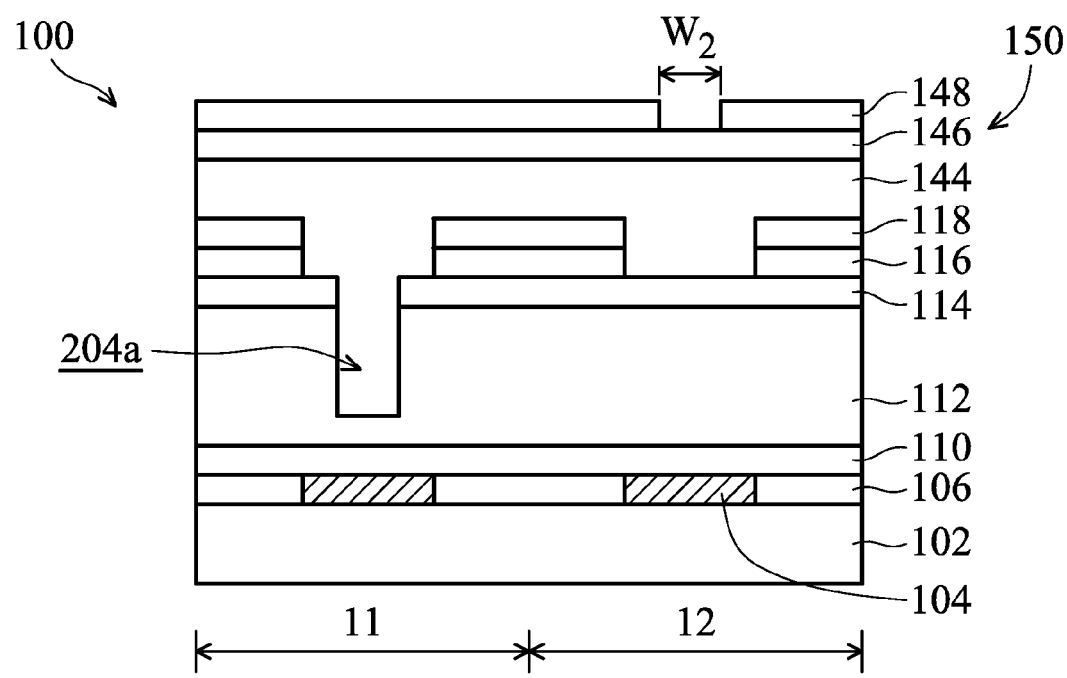

After first PR structure 130 is removed, a second PR structure 150 is formed in first via hole 204a and on ARC layer 118 as shown in FIG. 1G, in accordance with some embodiments of the disclosure. In some embodiments, second PR structure 150 is a tri-layer structure which includes a second bottom anti-reflective coating (BARC) layer 144, a second middle layer 146 and a second top layer 148.

Afterwards, second top layer 148 is patterned to form a patterned second top layer 148. In second region 12, patterned second top layer 148 has an opening with a second width $W_2$.

Figure 1H:
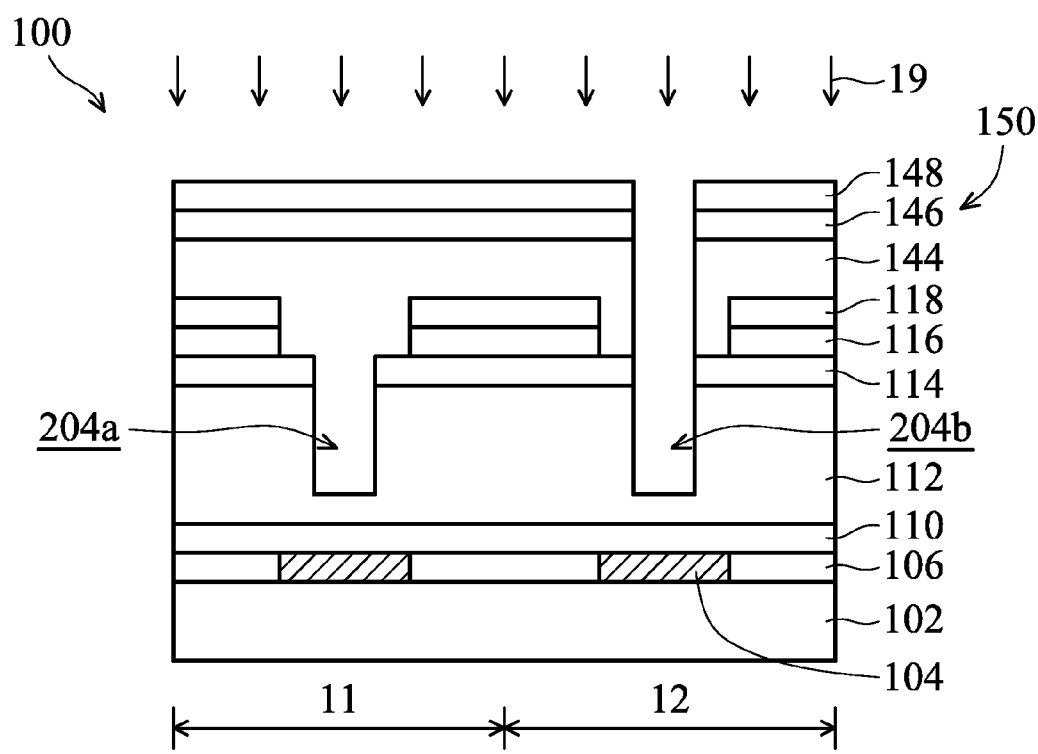

After patterned second top layer 148 is formed, a third etching process 19 is performed on second middle layer 146, second BARC layer 144, ARC layer 118, hard mask layer 116, second etch stop layer 114 and second dielectric layer 112 as shown in FIG. 1H, in accordance with some embodiments of the disclosure. Third etching process 19 includes multiple etching processes to remove a different layer below second top layer 148.

As a result, in first region 12, a second via hole 204b is formed in second dielectric layer 112. Second via hole 204a has a second width $W_2$ which is smaller than first width $W_1$ (first width $W_1$ is shown in FIG. 1C).

It should be noted that as the feature size decreases to 20 nm and beyond, 2P2E process is provided to define two adjacent patterns with a pitch smaller than 90 nm. The 2P2E process described above includes performing a patterning process (as shown in FIG. 1D) and an etching process (as shown in FIG. 1E) in first region 11, and performing a patterning process (as shown in FIG. 1G) and an etching process (as shown in FIG. 1H) in second region 12.

Figure 1I:
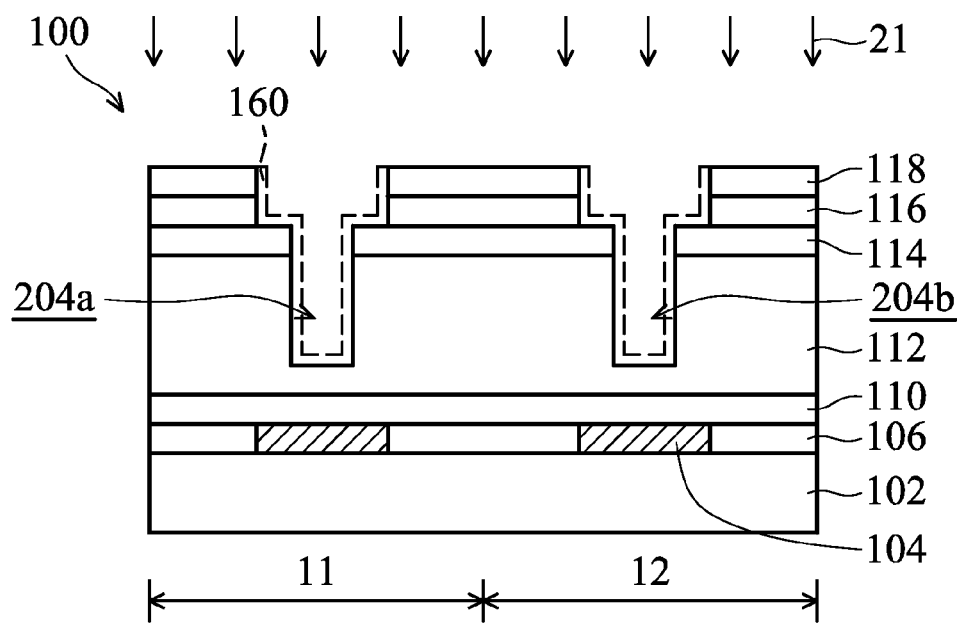

Afterwards, a stripping process 21 is performed to remove second PR structure 150 as shown in FIG. 1I, in accordance with some embodiments of the disclosure. In some embodiments, stripping process 21 is a plasma process.

Since sidewalls of second dielectric layer 112 are exposed when stripping process 21 is performed, second dielectric layer 112 may be damaged during stripping process 21. Furthermore, residual materials are generated from reaction products of second dielectric layer 112 and/or layers 114,116, 118 with plasma gas species. In some embodiments, residual materials include a re-sputtered silicon containing material from second dielectric layer 112 and/or layers 114,116,118.

If oxygen ($O_2$) plasma is used in the stripping process, second dielectric layer 112, which includes ELK dielectric material, tends to react with oxygen gas. As a result, some polymers may form on the bottom portion or sidewalls of first via hole 204a and second via hole 204b. Furthermore, hard mask layer 116 (such as TiN) may react with oxygen ($O_2$) gas, and some hard-to-remove metal residues may also be deposited on the bottom portion or sidewalls of first via hole 204a and second via hole 204b. In addition, some by-products may re-sputter on the sidewalls of second dielectric layer 112. Therefore, second dielectric layer 112 is damaged during stripping process 21. This damage may cause a higher resistance (Rc) and therefore degrade device performance.

In order to reduce, prevent, or minimize damage, the disclosure provides stripping process 21 by a plasma process using a CxHyOz gas. CxHyOz gas is softer than $O_2$ gas, so that the damage of sidewalls of second dielectric layer 112 is minimized during stripping process 21. In some embodiments, carbon dioxide ($CO_2$) gas is used in stripping process 21. In some other embodiments, CO, $O_2$, $H_2$ gas is used in stripping process 21.

Figure 2:
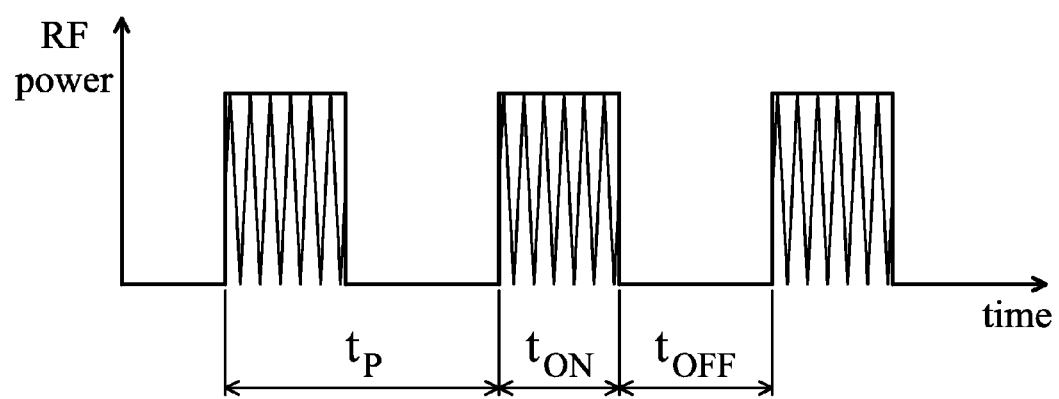
FIG. 2 shows the relationship between time and RF power of a pulsing method.

In addition, in some embodiments, stripping process 21 is performed with a "pulsing method". FIG. 2 shows the relationship between time and radio frequency (RF) power of the "pulsing method". RF power is turned on and off periodically. More specifically, RF power ("on" state) and zero power ("off" state) are sequentially applied to second PR structure 150 while stripping process 21 is performed.

When RF power is applied to second PR structure 150 ("on" state), second PR structure 150 is stripped by CxHyOz plasma. When RF power is turned off (the "off" state), a passivation film 160 (dotted line) is spontaneously formed along the sidewalls of second dielectric layer 112 and the sidewalls of layers 114, 116, 118 by reacting CxHyOz plasma with second PR structure 150. In some embodiments, passivation film 160 includes fluorocarbon (CxHyFz) compounds. By protecting passivation film 160, the sidewalls of second dielectric layer 112 are not damaged. As a consequence of stripping process 21 using CxHyOz plasma in the pulsing method, the original chemical and physical properties of second dielectric layer 112 are maintained. More specifically, the dielectric constant (K value) of second dielectric layer 112 is not changed while performing stripping process 21. In addition, the performance of semiconductor device structure 100 is improved, and the yield of semiconductor device structure 100 is further increased.

As shown in FIG. 2, a pulse "on" time is marked as $T_{on}$, and an RF pulse "off" time is marked as $T_{off}$. A Pulse duration is marked as $T_p$, which is the sum of $T_{on}$ and $T_{off}$. Pulse frequency is marked as $1/T_p$. The pulse duty ratio (power-on-time/total time) is marked as $T_{on}/T_p$.

In some embodiments, RF power is in a range from 0.1 wb to about 200 Wb. If RF power is too high, sidewalls of the ELK dielectric material may be damaged. If RF power is too low, the strip etch rate is too low to impact throughput. In some embodiments, pulse frequency ($1/T_p$) is in a range from about 50 Hz to about 1000 Hz. If pulse frequency is too high, the etch rate is higher, sidewalls of the ELK dielectric material may be damaged. If pulse frequency is too low, the throughput may be reduced or impacted. In some embodiments, pulse duty ratio ($T_{on}/T_p$) is in a range from about 10% to about 100%. If pulse duty ratio is too high, more by-products may be formed to generate particle pollution. If pulse duty ratio is too low, it easily suffers reflected power alarm and plasma off.

It should be noted that the disclosure provides a method to minimize or reduce damage to second dielectric layer 112 including ELK dielectric material by using a plasma process with CxHyOx gas. Furthermore, a passivation film is spontaneously formed on the sidewalls of second dielectric layer 112 when performing the plasma process using the "pulsing method", and therefore the K value of second dielectric layer 112 including ELK dielectric material is maintained.

After stripping process 21, a wet cleaning process is performed on first via hole 204a and second via hole 204b. The wet cleaning process is employed to remove any residual material left (such as passivation film 160) in first via hole 204a and second via hole 204b. In some embodiments, the wet cleaning process is carried out by dipping substrate 102 in a dilute hydrofluoric acid (DHF) solution with a concentration in a range from about 0.05% to about 50%.

Figure 1J:
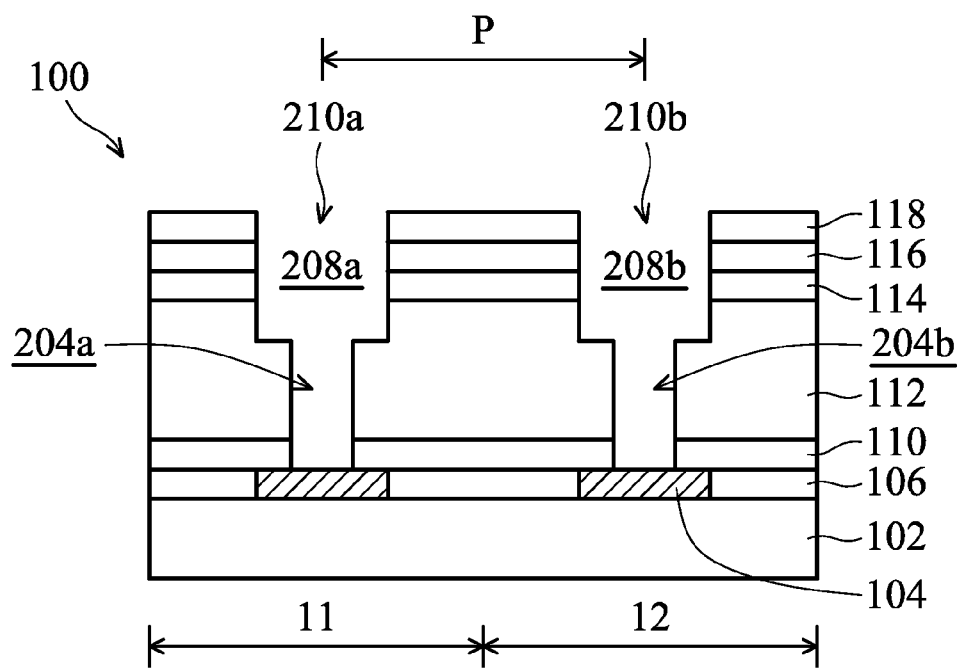

After stripping process 21, a portion of second etch stop layer 114, a portion of second dielectric layer 112 and a portion of first etch stop layer 110 are removed to expose first conductive feature 104 as shown in FIG. 1J, in accordance with some embodiments of the disclosure.

As shown in FIG. 1J, a first via hole 204a and a first trench hole 208a in first region 11 collectively constitute a first trench-via structure 210a for use as a dual damascene cavity. A second via hole 204b and a second trench hole 208b in second region 12 collectively constitute a second trench-via structure 210b. In some embodiments, a minimum pitch P between first trench-via structure 210a and second trench-via structure 210b is in a range from about about 70 nm to about 90 nm.

Figure 1K:
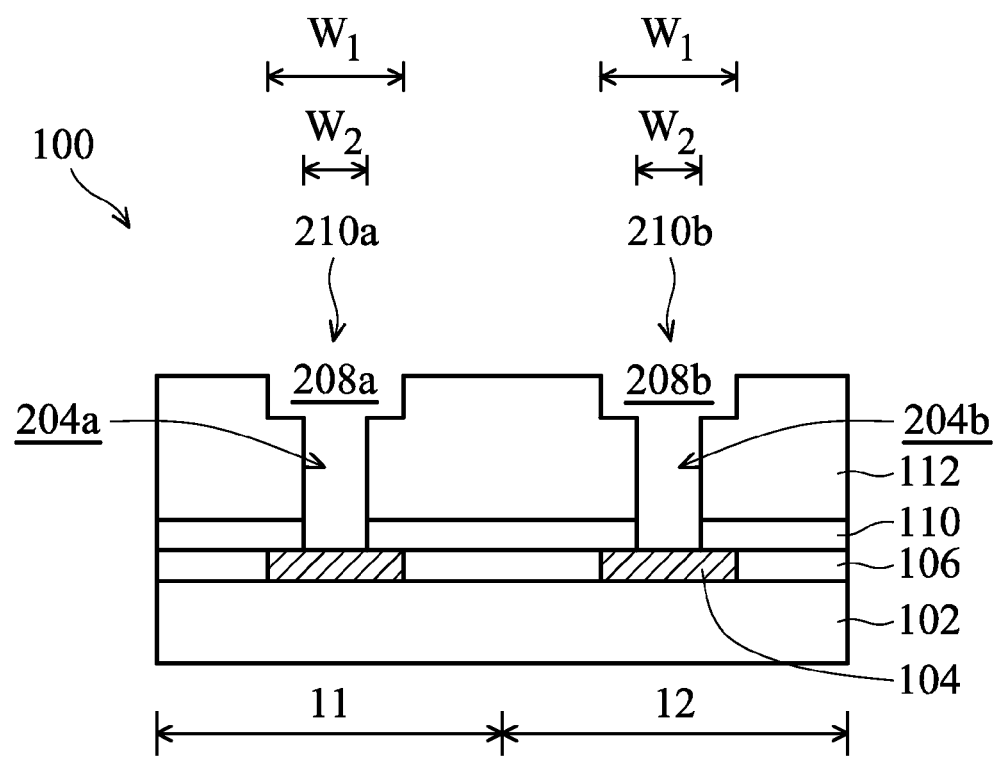

Afterwards, second etch stop layer 114, hard mask layer 116 and ARC 118 are removed as shown in FIG. 1K, in accordance with some embodiments of the disclosure. In some embodiments, second etch stop layer 114, hard mask layer 116 and ARC 118 are removed by a chemical mechanical polishing (CMP) process.

First trench-via structure 210a has a wider upper portion (such as first trench hole 208a) and a narrower lower portion (such as first via hole 204a) in first region 11, and second trench-via structure 201b has a wider upper portion (such as second trench hole 208b) and a narrower lower portion (such as second via hole 204b) in second region 12.

Figure 1L:
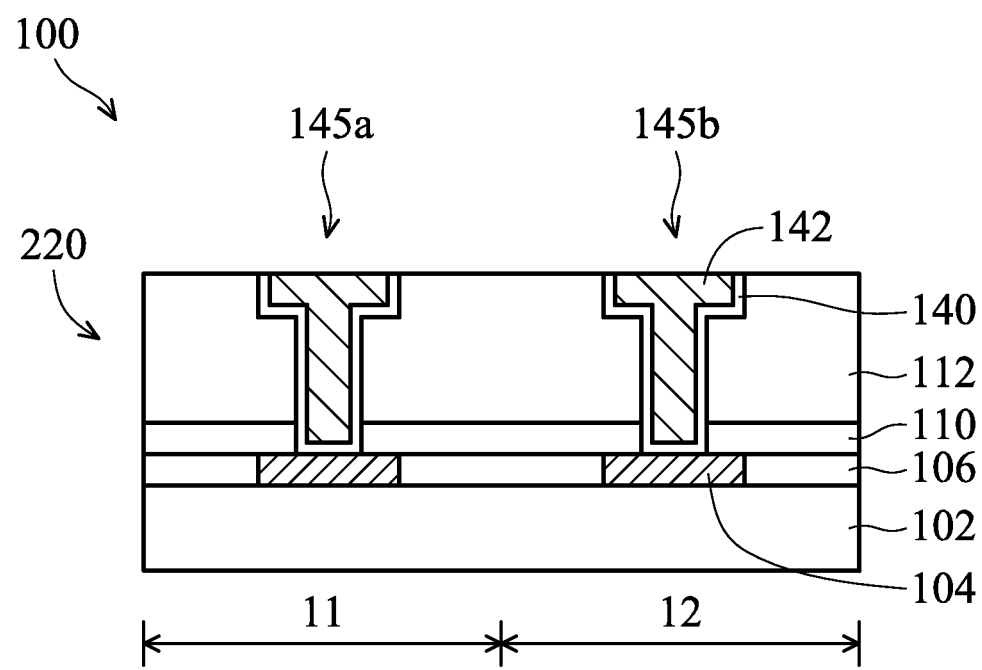

Afterwards, a diffusion barrier layer 140 is formed in first trench-via structure 210a and second trench-via structure 210b, and a second conductive feature 142 is formed on diffusion barrier layer 140 as shown in FIG. 1L, in accordance with some embodiments of the disclosure. In other words, second conductive feature 142 is formed in second dielectric layer 112, and it is surrounded by diffusion barrier layer 140. A first conductive structure 145a in first region 11 and a second conductive structure 145b in second region 12 are formed. Second conductive feature 142 is electrically connected to first conductive feature 104. First conductive feature 104 embedded in first dielectric layer 106 and second conductive feature 142 embedded in second dielectric layer 112 construct an interconnect structure 220.

In some embodiments, diffusion barrier layer 140 may be made of titanium (Ti), titanium nitride (TiN), tantalum (Ta), tantalum nitride (TaN), or aluminum nitride (AlN). In some embodiments, second conductive feature 142 is made of copper, and diffusion barrier layer 202 includes TaN/Ta bi-layer.

It should be noted that a metal contact between second conductive feature 142 and first conductive feature 104 is degraded if there is any residual materials left over in first trench-via structure 210a and second trench-via structure 210b. By performing CxHyOx plasma by the pulsing method, the residual materials are removed without damaging the sidewalls of second dielectric layer 112. Therefore, metal contact between second conductive feature 142 and first conductive feature 104 is not degraded and the K value of second dielectric layer 112 is maintained and not changed.

Afterwards, the processing steps of FIGS. 1A-1L may be repeated to construct a multi-level dual damascene metal interconnect structure (not shown).

Embodiments for forming a semiconductor structure with an interconnect structure are provided. A two-patterning-two-etching (2P2E) process is used to pattern two adjacent patterns with a pitch smaller than 90 nm. First, a first via hole is formed in a dielectric layer including ELK dielectric material by a first patterning process and a first etching process of a 2P2E process. In order to form a second via hole in the dielectric layer, a photoresist is filled into the first via hole, and a second via hole is formed by a second patterning process and a second etching process of 2P2E process. The photoresist is removed or stripped by a plasma process using CxHyOz gas to minimize damage to the dielectric layer. In addition, a "pulsing method" and CxHyOz plasma are simultaneously used to form a passivation film on the sidewalls of the dielectric layer to prevent the dielectric layer from being damaged. Therefore, the K value of the dielectric layer is maintained and not changed. In addition, the performance of the semiconductor device structure is improved, and the manufacturing yield of the semiconductor device structure is further increased.

In some embodiments, a method for forming an interconnect structure is provided. The method includes providing a substrate. The method also includes forming a dielectric layer on the substrate, and the dielectric layer includes an extreme low-k (ELK) dielectric layer. The method includes forming a via hole in the dielectric layer and forming a photoresist in the via hole and on the dielectric layer. The method also includes removing the photoresist by a plasma process using a CxHyOz gas and forming a conductive structure in the via hole.

In some embodiments, a method for forming an interconnect structure is provided. The method includes providing a substrate, and the substrate includes a first region and a second region. The method also includes forming a dielectric layer on the substrate, and the dielectric layer comprises an extreme low-k (ELK) dielectric layer. The method includes forming a first photoresist (PR) structure on the dielectric layer and performing a first patterning process to form a patterned first PR structure on the dielectric layer. The method also includes performing a first etching process on the dielectric layer to form a first via hole in the dielectric layer in the first region and removing the patterned first PR structure. The method further includes forming a second PR structure in the first via hole and on the dielectric layer and performing a second patterning process to form a patterned second PR structure. The method includes performing a second etching process on the dielectric layer to form a second via hole in the dielectric layer in the second region. The method includes stripping the patterning second PR structure by a plasma process using CxHyOz gas, and the plasma process is performed with a pulsing method. The method includes filling a conductive material into the first via hole and the second via hole.

In some embodiments, a method for forming an interconnect structure is provided. The method includes providing a substrate, and the substrate includes a first region and a second region. The method includes forming a dielectric layer on the substrate, and the dielectric layer comprises an extreme low-k (ELK) dielectric layer. The method also includes forming a hard mask layer on the dielectric layer and patterning the hard mask layer by using a patterned first photoresist (PR) layer as a mask to form a patterned hard mask layer. The method further includes forming and patterning a second PR structure on the patterned hard mask layer to form a patterned second PR structure. The method includes etching a portion of dielectric layer in the first region to form a first via hole and removing the patterned second PR structure. The method includes forming and patterning a third PR structure in the first via hole and on the first via hole and etching a portion of the dielectric layer in the second region to form a second via hole. The method includes removing the patterned third PR structure by a stripping process with a CxHyOz gas, and the stripping process is performed with a pulsing method. The method includes etching a portion of the dielectric layer to form a first trench-via structure including the first via hole and a second trench-via structure including the second via hole.

The method also includes filling a conductive material into the first trench-via structure and the second trench-via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an interconnect structure, comprising:
   providing a substrate;
   forming a dielectric layer on the substrate, wherein the dielectric layer comprises an extreme low-k (ELK) dielectric layer;
   forming a via hole in the dielectric layer;
   forming a photoresist in the via hole and on the dielectric layer;
   removing the photoresist by a plasma process using a CxHyOz gas; and
   forming a conductive structure in the via hole.

2. The method for forming the interconnect structure as claimed in claim 1, wherein removing the photoresist by the plasma process further comprises using a pulsing method.

3. The method for forming the interconnect structure as claimed in claim 2, wherein the pulsing method is performed with a RF power in a range from about 0.1 Wb to about 200 Wb.

4. The method for forming the interconnect structure as claimed in claim 2, wherein the pulsing method is performed at a pulse frequency ($1/T_p$) in a range from about 50 Hz to about 1000 Hz.

5. The method for forming the interconnect structure as claimed in claim 1, wherein forming the photoresist in the via hole and on the dielectric layer comprises:
   forming a bottom anti-reflective coating (BARC) layer in the via hole and on the dielectric layer, wherein the via hole is completely filled with the BARC layer;
   forming a middle layer on the BARC layer; and
   forming a top layer on the middle layer.

6. The method for forming the interconnect structure as claimed in claim 1, further comprising:
   forming an etch stop layer below the dielectric layer, wherein the etch stop layer comprises a tetraethoxysilane (TEOS) layer.

7. The method for forming the interconnect structure as claimed in claim 1, wherein before forming the via hole in the dielectric layer, the method further comprises:
   forming a hard mask layer on the dielectric layer; and
   patterning the hard mask layer to form a patterned hard mask layer, wherein the patterned hard mask layer has an opening with a first width, and the via hole has a second width which is smaller than the first width.

8. The method for forming the interconnect structure as claimed in claim 1, wherein forming the conductive structure comprises:
   forming a diffusion barrier layer in the via hole; and
   forming a conductive feature on the diffusion barrier layer.

9. The method for forming the interconnect structure as claimed in claim 1, wherein after removing the photoresist by the plasma process, the method further comprises:
   performing a wet cleaning process on the via hole.

10. A method for forming an interconnect structure, comprising:
    providing a substrate, wherein the substrate comprises a first region and a second region;
    forming a dielectric layer on the substrate, wherein the dielectric layer comprises an extreme low-k (ELK) dielectric layer;
    forming a first photoresist (PR) structure on the dielectric layer;
    performing a first patterning process to form a patterned first PR structure on the dielectric layer;
    performing a first etching process on the dielectric layer to form a first via hole in the dielectric layer in the first region;
    removing the patterned first PR structure;
    forming a second PR structure in the first via hole and on the dielectric layer;
    performing a second patterning process to form a patterned second PR structure;
    performing a second etching process on the dielectric layer to form a second via hole in the dielectric layer in the second region;
    stripping the patterned second PR structure by a plasma process with a CxHyOz gas, wherein the plasma process is performed with a pulsing method; and
    filling a conductive material into the first via hole and the second via hole.

11. The method for forming the interconnect structure as claimed in claim 10, wherein a pitch between the first via hole and the second via hole is in a range from about 70 nm to about 90 nm.

12. The method for forming the interconnect structure as claimed in claim 10, wherein before performing the first patterning process, the method further comprises:
    forming a hard mask layer on the dielectric layer; and
    patterning the hard mask layer to form a patterned hard mask layer on the dielectric layer, wherein the patterned hard mask layer has an opening with a first width, and the first via hole has a second width which is smaller than the first width.

13. The method for forming the interconnect structure as claimed in claim 12, wherein after stripping the second PR structure by the plasma process, the method further comprises:
    etching a portion of the dielectric layer by using the patterned hard mask layer as a mask to form a trench-via structure in the dielectric layer, wherein the trench-via structure has a wider upper portion and a narrower lower portion.

14. The method for forming the interconnect structure as claimed in claim 10, wherein the pulsing method is performed at a pulse duty ratio ($T_{on}/T_p$) in a range from about 10% to about 100%.

15. The method for forming the interconnect structure as claimed in claim 10, wherein the pulsing method is performed at a pulse frequency ($1/T_p$) in a range from about 50 Hz to about 1000 Hz.

16. The method for forming the interconnect structure as claimed in claim 10, further comprising:
    forming an etch stop layer below the dielectric layer, wherein the etch stop layer comprises a tetraethoxysilane (TEOS) layer.

17. A method for forming an interconnect structure, comprising:
- providing a substrate, wherein the substrate comprises a first region and a second region;
- forming a dielectric layer on the substrate, wherein the dielectric layer comprises an extreme low-k (ELK) dielectric layer;
- forming a hard mask layer on the dielectric layer;
- patterning the hard mask layer by using a patterned first photoresist (PR) layer as a mask to form a patterned hard mask layer;
- forming and patterning a second PR structure on the patterned hard mask layer to form a patterned second PR structure;
- etching a portion of the dielectric layer in the first region to form a first via hole;
- removing the patterned second PR structure;
- forming and patterning a third PR structure in the first via hole and on the first via hole;
- etching a portion of the dielectric layer in the second region to form a second via hole;
- removing the patterned third PR structure by a stripping process using a CxHyOz gas, wherein the stripping process is performed with a pulsing method;
- etching a portion of the dielectric layer to form a first trench-via structure including the first via hole and a second trench-via structure including the second via hole; and
- filling a conductive material into the first trench-via structure and the second trench-via structure.

18. The method for forming the interconnect structure as claimed in claim 17, wherein removing the patterned third PR structure by the stripping process using the CxHyOz gas further comprises forming a passivation film on the sidewalls of the dielectric layer.

19. The method for forming the interconnect structure as claimed in claim 17, wherein a pitch between the first via hole and the second via hole is in a range from about 70 nm to about 90 nm.

20. The method for forming the interconnect structure as claimed in claim 17, further comprising:
- forming an etch stop layer below the dielectric layer, wherein the etch stop layer comprises a tetraethoxysilane (TEOS) layer.

* * * * *